US008691621B1

(12) United States Patent
Ulmer et al.

(10) Patent No.: US 8,691,621 B1
(45) Date of Patent: Apr. 8, 2014

(54) THIOL BOND FORMATION CONCURRENT WITH SILVER NANOPARTICLE INK THERMAL TREATMENT

(71) Applicant: Sharp Laboratories of America, Inc., Camas, WA (US)

(72) Inventors: Kurt Ulmer, Vancouver, WA (US); Kanan Puntambekar, Chicago, IL (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 13/682,602

(22) Filed: Nov. 20, 2012

Related U.S. Application Data

(63) Continuation-in-part of application No. 12/968,102, filed on Dec. 14, 2010, now Pat. No. 8,367,459.

(51) Int. Cl.
*H01L 51/10* (2006.01)
*H01L 51/30* (2006.01)
*H01L 51/40* (2006.01)

(52) U.S. Cl.
USPC ............. 438/99; 438/795; 438/151; 257/400; 257/E51.006; 257/E51.02; 257/410; 257/92

(58) Field of Classification Search
USPC ........................................... 438/99, 795, 151
See application file for complete search history.

(56) References Cited

U.S. PATENT DOCUMENTS

| 7,719,496 | B2 | 5/2010 | Ahn et al. | |
|---|---|---|---|---|
| 7,872,257 | B2 | 1/2011 | Hashizume et al. | |
| 8,053,761 | B2 | 11/2011 | Hahn et al. | |
| 2007/0194386 | A1* | 8/2007 | Hahn et al. | 257/368 |
| 2010/0065830 | A1* | 3/2010 | Kim et al. | 257/40 |

* cited by examiner

*Primary Examiner* — Cathy N Lam
(74) *Attorney, Agent, or Firm* — Law Office of Gerald Maliszewski; Gerald Maliszewski (57) ABSTRACT

A method is provided for preparing a printed metal surface for the deposition of an organic semiconductor material. The method provides a substrate with a top surface, and a metal layer is formed overlying the substrate top surface. Simultaneous with a thermal treatment of the metal layer, the metal layer is exposed to a gaseous atmosphere with thiol molecules. In response to exposing the metal layer to the gaseous atmosphere with thiol molecules, the work function of the metal layer is increased. Subsequent to the thermal treatment, an organic semiconductor material is deposited overlying the metal layer. In one aspect, the metal layer is exposed to the gaseous atmosphere with thiol molecules by evaporating a liquid containing thiol molecules in an ambient air atmosphere. Alternatively, a delivery gas is passed through a liquid containing thiol molecules. An organic thin-film transistor (OTFT) and OTFT fabrication process are also provided.

13 Claims, 4 Drawing Sheets

THIOL BOND FORMATION CONCURRENT WITH SILVER NANOPARTICLE INK THERMAL TREATMENT

RELATED APPLICATIONS

This application is a continuation-in-part of a pending patent application entitled, ORGANIC SEMICONDUCTOR INTERFACE PREPARATION, invented by Lisa Stecker et al., Ser. No. 12/968,102, filed Dec. 14, 2010, which is incorporated herein by reference.

BACKGROUND OF THE INVENTION

1. Field of the Invention

This invention generally relates to integrated circuit (IC) fabrication and, more particularly, to an organic thin film transistor (OTFT) and printed metal thiol treatment.

2. Description of the Related Art

As noted in Wikipedia, printed electronics is a set of printing methods used to create electrical devices on various substrates. Printing typically uses common printing equipment or other low-cost equipment suitable for defining patterns on material, such as screen printing, flexography, gravure, offset lithography and inkjet. Electrically functional electronic or optical inks are deposited on the substrate, creating for example, active or passive devices, such as thin film transistors or resistors. These processes can utilize any liquid phase material, including, but not limited to, solutions, mixtures, and dispersions containing organic semiconductors, inorganic semiconductors, organic dielectrics, inorganic dielectrics, metallic conductors, oxide conductors, organic conductors, nanowires, nanoparticles, nanotubes, and nanotubes.

The attraction of printing technology for the fabrication of electronics mainly results from the possibility of preparing stacks of micro-structured layers (and thereby thin-film devices) over large areas in a much simpler and cost-effective way, as compared to conventional electronics. Also, the ability to implement new or improved functionalities (e.g. mechanical flexibility) plays a role.

Organic field-effect transistors and integrated circuits can be prepared completely by means of mass-printing methods. The selection of print methods for the different layers is determined by dimensional requirements and the properties of printed materials, as well as economic and technical considerations of the final printed products. Optimal resolution of these considerations typically results in a combination of several print methods for the fabrications of the devices, as opposed to a single method.

Inkjets are flexible and versatile, and can be set up with relatively little effort. Inkjets are currently the most commonly used method for the preparation of printed electronics. However, inkjets offer a lower throughput of around 100 $m^2$/h and lower resolution (ca. 10-20 μm) than other printing methods such as gravure. Simultaneously using many nozzles and pre-structuring the substrate permits improvements in productivity and resolution. Inkjet printing is well suited for low-viscosity, soluble materials like organic semiconductors, and has proved useful in printing dispersed particles, like inorganic metal inks, with some observed difficulties due to nozzle clogging. Because ink is deposited via droplets, thickness and dispersion homogeneity is reduced. Inkjet printing is preferable for organic semiconductors in organic field-effect transistors (OFETs) and organic light-emitting diodes (OLEDs) due to viscosity constraints and high ink costs, but also OFETs completely prepared by this method have been demonstrated. Frontplanes and backplanes of OLED-displays, integrated circuits, organic photovoltaic cells (OPVCs), and other devices can be prepared with inkjets.

Screen printing is appropriate for fabricating electrics and electronics on industrial scales due to its ability to produce thick layers from paste-like materials. This method can produce conducting lines from inorganic materials (e.g. for circuit boards and antennas), but also insulating and passivating layers, whereby layer thickness is more important than high resolution. Its 50 $m^2$/h throughput and 100 μm resolution are similar to inkjets. This versatile and comparatively simple method is used mainly for conductive and dielectric layers, but also organic semiconductors, e.g. for OPVCs, and even complete OFETs can be printed.

Aerosol Jet Printing (also known as Maskless Mesoscale Materials Deposition or M3D) is another material deposition technology for printed electronics. The Aerosol Jet process begins with atomization of an ink, which can be heated up to 80° C., producing droplets on the order of one to two microns in diameter. The atomized droplets are entrained in a gas stream and delivered to the print head. Here, an annular flow of clean gas is introduced around the aerosol stream to focus the droplets into a tightly collimated beam of material. The combined gas streams exit the print head through a converging nozzle that compresses the aerosol stream to a diameter as small as 10 microns. The jet of droplets exits the print head at high velocity (~50 meters/second) and impinges upon the substrate. Electrical interconnects, as well as passive and active components are formed by moving the print head, equipped with a mechanical stop/start shutter, relative to the substrate. The resulting patterns can have features ranging from 10 microns wide, with layer thicknesses from 10's of nanometers to >10 microns. A wide nozzle print head enables efficient patterning of millimeter size electronic features and surface coating applications. All printing occurs without the use of vacuum or pressure chambers and at room temperature. The high exit velocity of the jet enables a relatively large separation between the print head and the substrate, typically 2-5 mm. The droplets remain tightly focused over this distance, resulting in the ability to print conformal patterns over three dimensional substrates. Despite the high velocity, the printing process is gentle; substrate damage does not occur and there is generally no splatter or overspray from the droplets. Once patterning is complete, the printed ink typically requires post-treatment to attain final electrical and mechanical properties. Post-treatment is driven more by the specific ink and substrate combination than by the printing process. A wide range of materials has been successfully deposited with the Aerosol Jet process, including diluted thick film pastes, thermosetting polymers such as UV-curable epoxies, and solvent-based polymers like polyurethane and polyimide, and biologic materials.

Printed electronics allows the use of flexible substrates, which lowers production costs and allows fabrication of mechanically flexible circuits. While inkjet and screen printing are used to pattern ink onto rigid substrates like glass and silicon, mass-printing methods nearly exclusively use flexible foil, polymers and paper.

Other methods with similarities to printing, among them micro contact printing and nano-imprint lithography, are of interest. Here, μm- and nm-sized layers are prepared by methods similar to stamping with soft and hard forms. Often the actual structures are prepared subtractively, e.g. by deposition of etch masks or by lift-off processes. For example, electrodes for OFETs can be prepared in this manner. Sporadically pad printing is used in a similar manner. Occasionally so-called transfer methods, where solid layers are transferred from a carrier to the substrate, are considered printed electronics.

As mentioned above, both organic and inorganic materials are commonly used for printed electronics. These ink materials must be available in liquid form, for solution, dispersion, or suspension. Additionally, they have varying functionality, to serve as conductors, semiconductors, dielectrics, or insulators. Electronic functionality and printability can interfere with each other, mandating careful optimization. For example, a higher molecular weight in polymers enhances conductivity, but diminishes solubility. For printing, viscosity, surface tension, and solid content must be tightly controlled. Cross-layer interactions such as wetting, adhesion, and solubility as well as post-deposition drying procedures affect the outcome. Additives often used in conventional printing inks are unavailable, because they often defeat electronic functionality.

The discovery of conjugated polymers and their development into soluble materials provided the first organic ink materials. Materials from this class of polymers variously possess conducting, semiconducting, electroluminescent, photovoltaic, and other properties. Other polymers are used mostly as insulators and dielectrics. Commonly used organic conducting polymers include polymers poly(3,4-ethylene dioxitiophene), doped with poly(styrene sulfonate), (PEDOT:PSS) and poly(aniline) (PANI). Both polymers are commercially available in different formulations and have been printed using inkjet, screen, and offset printing, as well as screen, flexo, and gravure printing.

Metal inks are also commonly used in printed electronics for reasons of improved conductivity and potential for surface functionality, as compared to their organic counterparts. Silver, gold, and copper nanoparticle inks are used with all of the printing processes described above.

An organic field-effect transistor (OFET) is a transistor that uses an organic semiconductor in its channel. Organic thin film transistors (OTFTs) are the most common and scalable type of OFET. OTFTs can be prepared either by vacuum evaporation of small molecules, by solution-casting of polymers or small molecules. These devices have been developed to realize low-cost, large-area electronic products. Additionally, OTFTs have been fabricated with various device geometries with different combinations of bottom and top source-drain and gate contacts.

Figure 1:
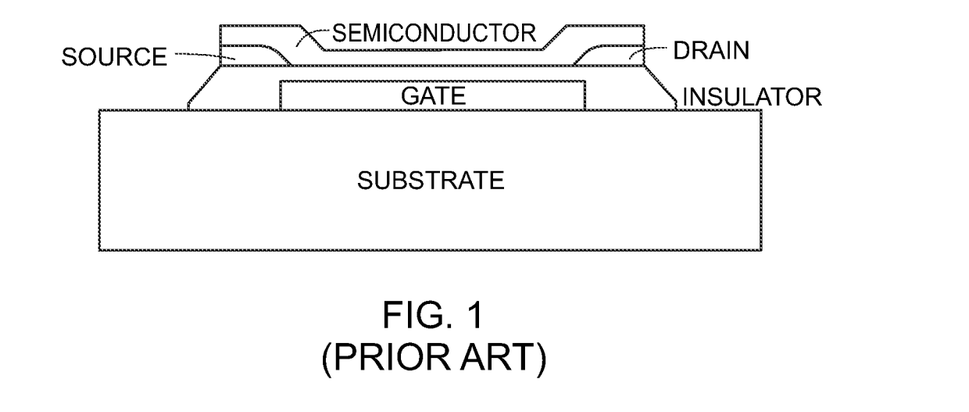
FIG. 1 is a partial cross-sectional view of a bottom gate TFT (prior art).

FIG. 1 is a partial cross-sectional view of a bottom gate TFT (prior art). In a bottom gate TFT a metal gate is deposited on a substrate followed by a gate insulator layer. The source and drain electrodes are patterned on the gate insulator layer. A semiconducting material is deposited onto the source and drain electrodes. In a top gate TFT the source and drain electrodes are directly deposited onto the channel (a thin layer of semiconductor), or a semiconductor material can be deposited onto the previously defined source and drain electrodes. Then, a thin film of insulator is deposited between the semiconductor and the metal gate contact. The choice of top or bottom gate structure is made based on intended application, material performance requirements, and process compatibility.

Organic polymers, such as poly(methyl-methacrylate) (PMMA), CYTOP, PVA, polystyrene, parylene, etc., can be used as a dielectric. OFETs employing numerous aromatic and conjugated materials as the active semiconducting layer have been reported, including small molecules such as rubrene, tetracene, pentacene, diindenoperylene, perylenediimides, tetracyanoquinodimethane (TCNQ), and polymers such as polythiophenes (especially poly 3-hexylthiophene (P3HT)), polyfluorene, polydiacetylene, poly 2,5-thienylene vinylene, poly p-phenylene vinylene (PPV). These can be deposited via vacuum or solution base methods, the later being of interest for printed electronics. The newer generation of solution processable organic semiconductors consists of blends of high performance small molecule and polymeric molecules for optimum performance and uniformity.

Various strategies are being devised to improve the device performance of all solution processed, printed organic transistor devices. One of the crucial elements for improving device performance is optimization of the semiconductor and source/drain electrode interfaces in order to obtain good ohmic contacts with very low contact resistance. In the case of all printed organic transistor devices, the metal is typically deposited using a solvent based ink with a number of additives that enable good printing properties of the ink. Metallic silver nanoparticle based inks are currently the most popular candidates for printing the gate and source/drain layers of the device in the case of printed organic devices. In the case of printed metals however, it is hard to get a pristine surface for two reasons: (i) the electrodes are typically thermally treated in air for 15-30 minutes to drive off the solvents and sinter the metal nanoparticles (NPs); and, (ii) the residue of solvents and additives in the inks, both of which are likely to lead to contamination on the metal surface. This leads to a non-ideal surface treatment and consequently results in poor contact properties.

The metal source drain electrodes are typically coated with a surface treatment layer (e.g., a thiol layer) in order to tune the energy level alignment and reduce the energy barrier for charge injection at the metal-semiconductor interface. These surface treatments rely on pristine metal surfaces for optimum effectiveness. A thiol treatment has proven effective in the case of pristine evaporated metal source and drain contact surfaces, but has not proven effective when applied to post-thermally treated printed metals due to the reasons mentioned above. As disclosed in the parent application entitled, ORGANIC SEMICONDUCTOR INTERFACE PREPARATION, invented by Lisa Stecker et al., Ser. No. 12/968,102, filed Dec. 14, 2010, this problem can be addressed by treating the printed metal surface with plasma, prior to applying the liquid thiol.

A thiol is an organosulfur compound that contains a carbon-bonded sulfhydryl (—C-SH or R-SH) group (where R represents an alkane, alkene, or other carbon-containing group of atoms). Thiols are the sulfur analogue of alcohols (that is, sulfur takes the place of oxygen in the hydroxyl group of an alcohol). The —SH functional group itself is referred to as either a thiol group or a sulfhydryl group.

It would be advantageous if the surfaces of printed metals and electrodes could be treated to improve the work function and contact properties with subsequently deposited organic semiconductors.

It would be advantageous if the above-mentioned improvements could be obtained without the extra step of a plasma treatment.

SUMMARY OF THE INVENTION

Disclosed herein is a method for modifying a conventional printed ink thermal treatment process, with the printed metal ink being thermally treated in presence of a concentrated environment of the thiol molecules, instead of just air. This process has been shown to result in an effective thiol treatment. Further, this process also removes the additional steps of a plasma treatment, or a thiol treatment performed after thermally treating, since the disclosed process is performed simultaneously with the thermal treatment step. The process has application for the printed metal used as a source/drain electrode deposited using a printing technology. It can however, also be broadly used anywhere in the context of a thermal or photo thermal treatment of metallic inks in order to improve the surface properties.

The electrode is designated to come into contact with a semiconductor material through a conduction and/or adhesion promoter layer such as a thiol treatment or other solubilizing or functionalizing materials. The thermal treatment of the printed metal in the presence of the self-assembled molecule of interest results in successful functionalization simultaneously with the thermal treatment processes that drive off solvents and sinter nanoparticles, thus resulting in optimized electrodes.

The disclosed process allows for very low temperature processing (same as the thermal treatment temperature for the printed ink) that does not require the use of high cost or specialized equipment, and does not employ high vacuum technology for the processing of printed electronics. It is not necessary to evacuate the thermal treatment chamber; this process can be performed on a hot plate by creating a local region of high concentration of the self-assembled molecule. It can be employed concurrently with the printed metal thermal treatment process. It does not require any additional steps or tools. While examples presented herein primarily pertain to organic semiconductor, this process is by no means limited to the case of organic TFTs but can be applied generically when dealing with printed metal for printed electronics applications.

Accordingly, a method is provided for preparing a printed metal surface for the deposition of an organic semiconductor material. The method provides a substrate with a top surface, and a metal layer is formed overlying the substrate top surface. Simultaneous with a thermal treatment of the metal layer, the metal layer is exposed to a gaseous atmosphere with thiol molecules. In response to exposing the metal layer to the gaseous atmosphere with thiol molecules, the work function of the metal layer is increased. Subsequent to the thermal treatment, an organic semiconductor material is deposited overlying the metal layer. In one aspect, the metal layer is exposed to the gaseous atmosphere with thiol molecules, by evaporating a liquid containing thiol molecules in an ambient air atmosphere. Alternatively, a delivery gas is passed through a liquid containing thiol molecules.

If the metal layer is a printed metal, it typically includes solvents. The thermal treatment of the printed metal evaporates the solvents, and sulfur from the thiol molecules bonds with the printed metal top surface. Alternatively stated, the thiol leads to the formation of a self-assembled monolayer (SAM) that forms between the metal layer and the subsequently deposited organic semiconductor. In one aspect, the printed metal layers are source/drain electrodes and the organic semiconductor material is the active layer of an organic thin-film transistor (OTFT).

Additional details of the above-described method, and a printed OTFT, are provided below.

DETAILED DESCRIPTION

Figure 2:
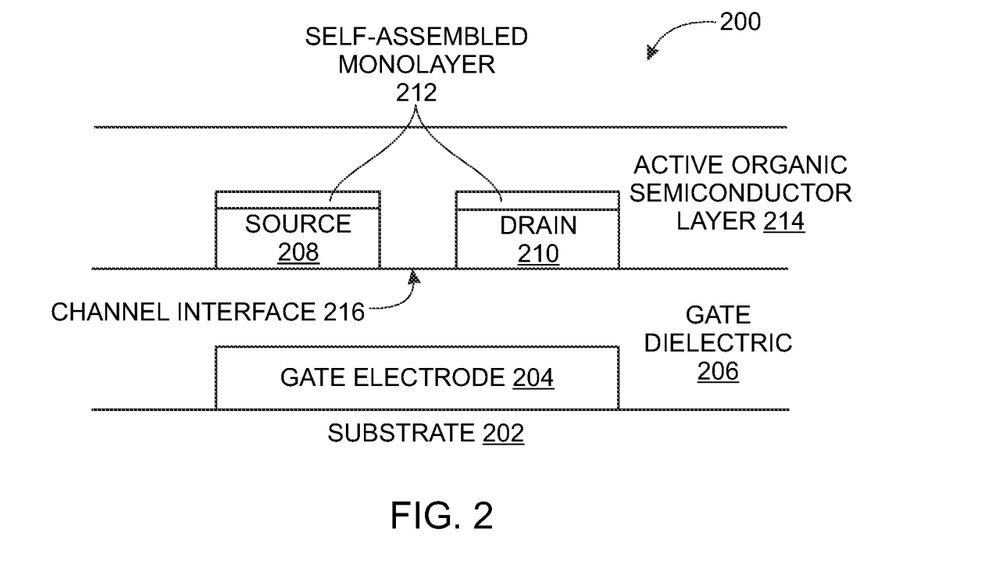
FIG. 2 is a partial cross-sectional view of a printed organic thin film transistor (OTFT).

FIG. 2 is a partial cross-sectional view of a printed organic thin film transistor (OTFT). The OTFT 200 comprises a substrate 202 and a gate electrode 204 printed over the substrate 202. Although not explicitly shown, an insulator may be employed between the substrate 202 and gate electrode 204, as would be well understood in the art. A gate dielectric 206 is printed over the gate electrode 204. The gate dielectric 206 may be an organic insulator, ultra violet (UV) cross-linked organic polymer, or thermally cross-linked polymer.

Source (S) 208 and drain (D) 210 electrodes are printed over the gate dielectric 206. A number of metals, such as gold (Au), silver (Ag), palladium (Pd), copper (Cu), or platinum (Pt) may be deposited using a printing process. A self-assembled organic monolayer (SAM) 212 is interposed between the S/D electrodes 208/210 and an active organic semiconductor layer 214. The SAM includes sulfur that is bonded to the printed S/D electrodes 208/210. As explained in more detail below, thiol is one example of a material used in promoting the self-assembled monolayer 212. In one example, if the S electrode 208 and D electrode 210 are silver, they may have a work function of greater than, or equal to 5.1 electron volts (eV).

The active organic semiconductor layer 214 is printed over the S/D electrodes 208/210 and gate dielectric channel interface 216. The active organic semiconductor 214 may be a small molecule organic semiconductor, polymeric organic semiconductor, or a blend of the above-mentioned materials.

As noted in Wikipedia, self-assembled monolayers of organic molecules are molecular assemblies formed spontaneously on surfaces by adsorption and are organized into more or less large ordered domains. In some cases the molecules possess a functional group that has a strong affinity to the substrate and anchors the molecule to it. Such a SAM consists of a head group, tail, and functional end group. In the example described above, thiol would be a head group bonded to the printed metal S/D electrodes 208/210. Thiols are frequently used on noble metal substrates because of the strong affinity of sulfur for these metals.

Sulfur readily bonds to silver atoms at moderately elevated temperatures (<200° C.), and silver oxide is also thermodynamically stable. When the printed silver nanoparticle ink is heated, a solid surface of silver forms as the solvent evaporates and the nanoparticles sinter together. Upon heating, sulfur and oxygen become available from atmospheric sources such as hydrogen sulfide and water from surface bonds. Similarly, silver sulfur bonds are formed on the now solid silver surface as the atmosphere is saturated with thiol molecules.

Also disclosed is a process for printable electronics, in which the metalized electrodes are deposited through printing or stamping techniques. This process can be employed with any type substrate, such as glass, semiconductor, ceramic, or flexible plastic. The source metal can be (but not limited to) silver (Ag), gold (Au), platinum (Pt), palladium (Pd), or copper (Cu) based inks, or other metal based ink. Once deposited, electrode inks are cured according to the manufacture's specifications using heating and/or UV exposure in special environment as described below.

The metal surface modification is measured using ambient Kelvin probe measurements. These measurements provide the surface work function (WF) of the metal electrodes. Any change in the surface work function as a result of a surface treatment is a direct measure of surface modification. Also, the surface being evaluated is the same surface of the metal electrodes at its interface with the organic semiconductor (OSC) in the OTFT design. Thus, any measured changes in the work function of this surface correspond to a relative change in the contact interface work function with respect to the OSC material. The Kelvin probe can be used to make measurements to elucidate the modifications in the energy level alignment at the S/D-organic semiconductor (OSC) interface in the OTFT.

Experiment

In order to demonstrate the value of the process, five different scenarios of an experiment are presented below. Sample 1 is evaporated silver, samples 2-5 are printed silver.

Sample 1—Reference sample—This sample shows the reference (ideal) case of as-deposited evaporated silver and final surface work function after the application of a liquid thiol treatment (M1) on this surface. The aim of the disclosed process is to achieve a final surface work function comparable to this evaporated silver-M1 process, for a printed silver metal.

Sample 2—This sample shows the unmodified case where the printed metal was first thermally treated in air using a prescribed procedure (120° C., 20 minutes) and then the thiol surface treatment (M1) is performed. As is the case with Samples 3-5, the electrode inks were cured according to manufacturing specifications using heating and/or UV exposure in the specified ambient conditions. The metal nanoparticles in an ink solvent tend to have polymeric shells around them, to form good dispersions in organic solvents. After printing, the metal was thermally treated in air to drive off the solvent and also to sinter the particles. Thus, there is an inherent presence of organic impurities and/or oxidized surface layers present in the printed metal.

Sample 3—This sample shows the process disclosed in parent application Ser. No. 12/968,102, where an intermediate forming gas plasma treatment ($H_2/N_2$) was introduced after the printed metal thermal treatment, and before the M1 step.

Sample 4—This sample shows the case disclosed herein where the printed metal thermal treatment (120° C., 20 minutes) was performed in the presence of high concentration of the thiol formulation.

Sample 5—This sample shows the case with an increased thermal treatment time (120° C., 40 minutes) as compared to Sample 4.

Result Summary

Figure 3:
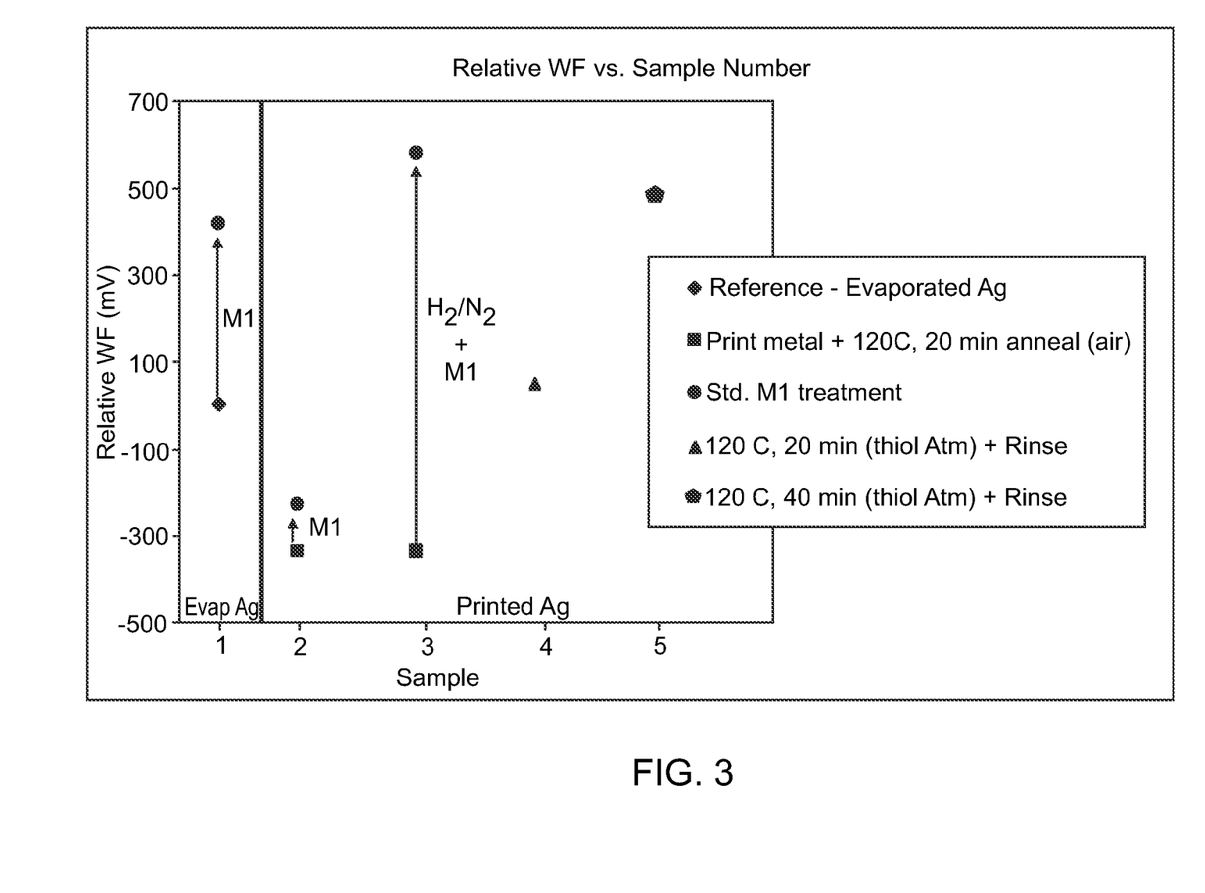
FIG. 3 is a plot summarizing the relative surface work function (WF) as a function of sample number (process conditions).

FIG. 3 is a plot summarizing the relative surface work function (WF) as a function of sample number (process conditions). The as-deposited evaporated silver (Sample 1) is used as a reference, and all the other conditions and samples are plotted with respect to it. In order to ensure a clean surface, the reference measurement was performed within minutes of unloading from the evaporation chamber.

For the reference case of evaporated Ag (evap Ag), the WF increases by more than about 400 mV after the M1 thiol treatment. This conventional thiol treatment involves a 1 minute soak of the metal surface in the thiol formulation followed by an isopropyl alcohol (IPA) rinse and one minute 100° C. thermal treatment in air, which is referred to herein as the Std. M1 treatment. The aim is to achieve a final surface work function comparable to M1 treated evaporated Ag case, for printed Ag. In Samples 2-5 the evaporated silver is replaced by the printing of Ag ink. In case of Sample 2, the print is followed by a standard thermal treatment step in air at 120° C. for 20 minutes. The surface work function of this printed Ag surface is observed to be >200 mV lower than the evaporated case, which in itself is an undesirable case. Further, when the M1 step is performed on this surface, the final WF is much lower than the final desired range (~600 mV lower than the desired value). In fact, it is even lower than the as-deposited Ag case (before the M1 step). Thus, a simple replacement of the evaporated silver by printed silver does not work.

In parent application Ser. No. 12/968,102, a forming gas plasma step was introduced to modify the printed silver surface for the optimal M1 treatment. The final result, after the M1 step, is shown in Sample 3 and is seen to be comparable, and even slightly improved with respect to the evaporated Ag counterpart. Here, a >500 mV increase in the surface WF is observed (after the M1 step), which is about 100 mV higher than the reference evaporated Ag.

In case of Sample 4 and Sample 5, where the print metal is thermally treated in the presence of thiol molecules in the atmosphere, a trend is observed in the desired direction. For a 20 minute thermal treatment (Sample 4), the final WF is slightly higher than the reference Ag (prior to the M1 step), but still lower than the desired value (after the M1 step). For a 40 minute thermal treatment (Sample 5) the WF is significantly higher (>500 mV than the evaporated Ag reference prior to the M1 step) and comparable to desired value (after the M1 step). Hence, with appropriate tuning of the process parameters such as time, temperature, and thiol concentration it is possible to achieve an optimal coating of the thiol molecule and desired WF range.

An additional benefit of this approach is that it requires a fewer number of steps, as the print metal thermal and other treatment steps are performed simultaneously.

Figure 4:
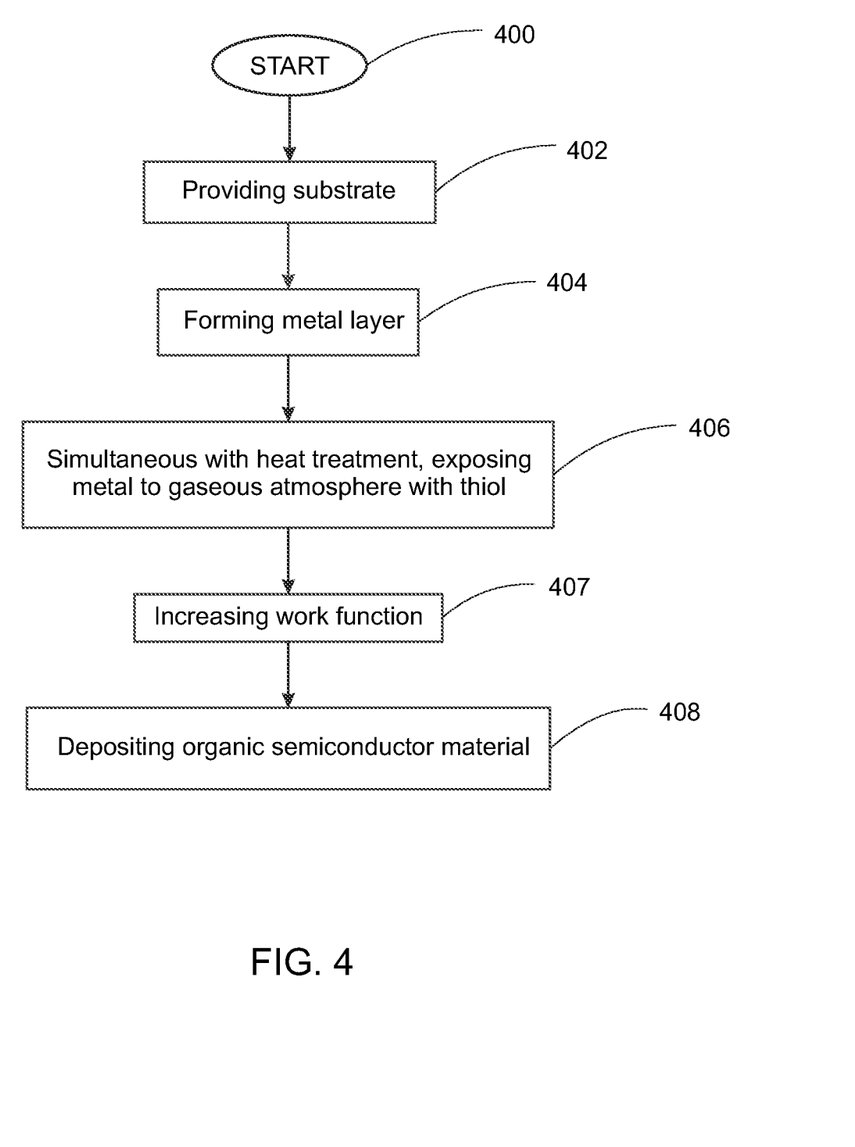
FIG. 4 is a flowchart illustrating a method for preparing a printed metal surface for the deposition of an organic semiconductor material in an integrated circuit (IC).

FIG. 4 is a flowchart illustrating a method for preparing a printed metal surface for the deposition of an organic semiconductor material in an integrated circuit (IC). Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 400.

Step 402 provides a substrate with a top surface. Step 404 forms a metal layer overlying the substrate top surface. Some examples of metals include silver (Ag), gold (Au), copper (Cu), palladium (Pd), and platinum (Pt). Simultaneous with a thermal treatment of the metal layer, Step 406 exposes the metal layer to a gaseous atmosphere with thiol molecules. For example, the metal layer may be thermally treated by heating at a temperature of about 120 degrees C. for a duration of about 40 minutes. As would be well understood by one with skill in the art, these variables are related. For example, an increase in temperature may require a shorter duration of time. Likewise, a longer duration of time may require a lower temperature.

In one aspect, Step 407 increases the work function of the metal layer in response to exposing the metal layer to the gaseous atmosphere with thiol molecules. Subsequent to the thermal treatment, Step 408 deposits an organic semiconductor material overlying the metal layer.

In one aspect, exposing the metal layer to the gaseous atmosphere with thiol molecules in Step 406 includes evaporating a liquid containing thiol molecules in an ambient air atmosphere. Alternatively, Step 406 passes a delivery gas through a liquid containing thiol molecules. Some examples of a delivery gas include flowing nitrogen or clean dry air.

In another aspect, forming the metal layer in Step 404 includes printing a metal that includes solvents. Some examples of processes capable of printing metal are inkjet printing, gravure printing, flexographic printing, offset printing, screen printing, spin-on coating, aerosol deposition, stamping, and dip-coating. Then, the thermal treatment of the printed metal in Step 406 evaporates the solvents, and exposing the metal layer to the gaseous atmosphere with thiol molecules includes sulfur from the thiol molecules bonding with a printed metal top surface. Alternatively stated, the thiol molecules promote the formation of a SAM between the printed metal and the OSC. If Step 404 deposits the metal layer by printing, then Step 408, of depositing the OSC material, may also be a printing deposition method.

If Step 404 prints a silver metal, increasing the work function of the metal layer in Step 407 includes forming a silver metal layer with a work function of greater than, or equal to 5.1 electron volts (eV).

Figure 5:
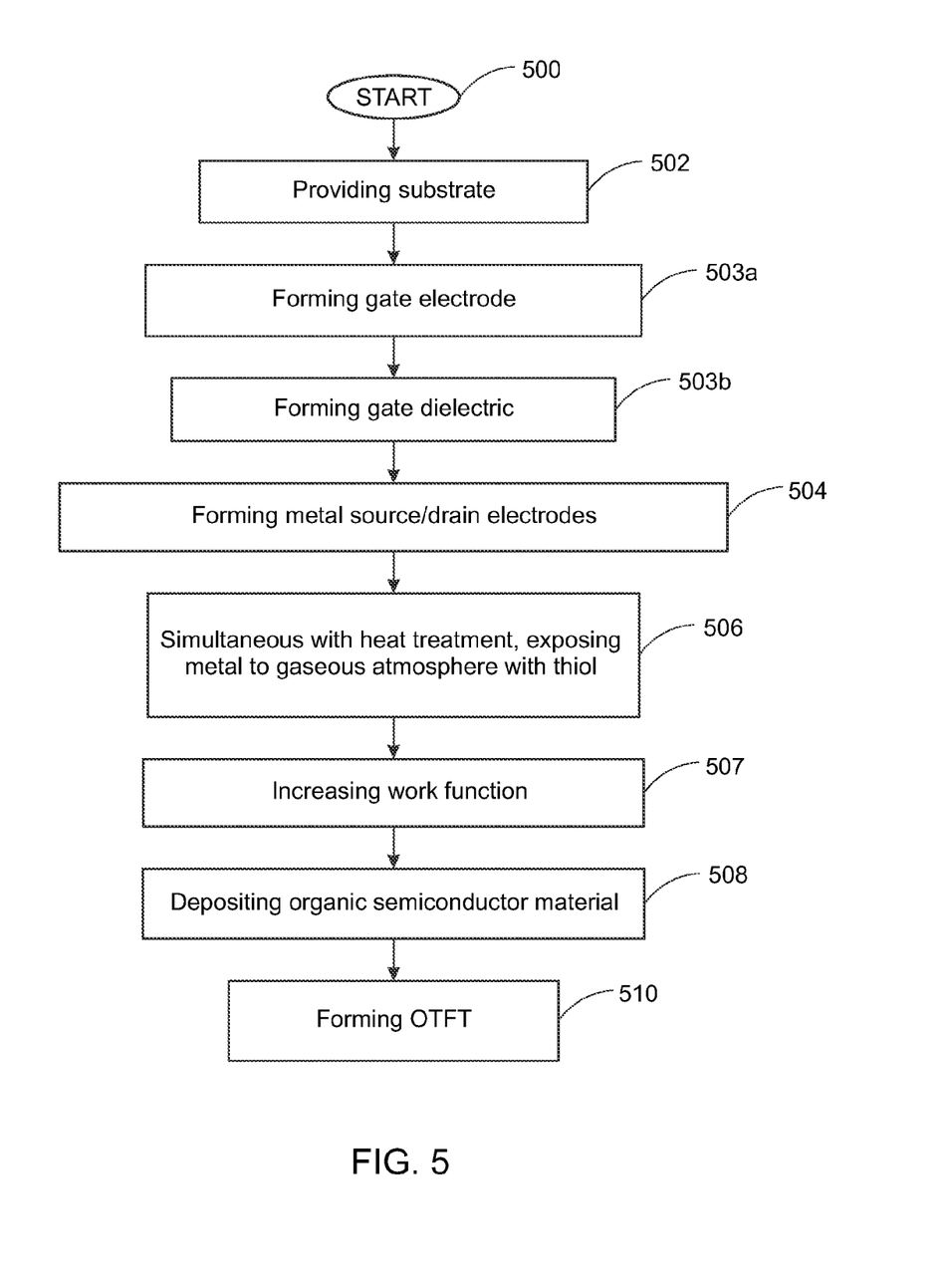
FIG. 5 is a flowchart illustrating an OTFT fabrication process.

FIG. 5 is a flowchart illustrating an OTFT fabrication process.

The method steps described above are part of this OTFT fabrication process, and are not repeated in the interest of brevity. However, these steps can be identified in the description of FIG. 4 by subtraction 100 from the step numbers in this flowchart.

Step 503a forms a gate electrode overlying the substrate. Step 503b forms a gate dielectric overlying the gate electrode. Step 504 (Step 404 of FIG. 4) forms metal layers in the form of source (S) and drain (D) electrodes overlying the gate dielectric, exposing a gate dielectric channel interface region between the S/D electrodes. For example, the metal layers may be printed. Then, depositing the organic semiconductor material overlying the metal layer in Step 508 (Step 408 of FIG. 4) includes forming an active organic semiconductor layer overlying the S/D electrodes and gate dielectric channel interface. Step 510 forms an OTFT.

The gate dielectric of Step 503b may be an organic insulator, ultra violet (UV) cross-linked organic polymer, or thermally cross-linked polymer. The organic semiconductor of Step 508 may be a small molecule organic semiconductor, polymeric organic semiconductor, and blends of the above-mentioned materials. Steps 503a, 503b, and 508 may be performed using a printing process.

Provided are an OTFT and associated printed metal thiol treatment process for preparing an interface surface for the deposition of an organic semiconductor material. Examples of particular materials and process steps have been presented to illustrate the invention. However, the invention is not limited to merely these examples. Although bottom gate OTFT devices have been described in detail, the invention is applicable to other transistor topologies, structures other than transistors, and materials other than OSC. Other variations and embodiments of the invention will occur to those skilled in the art.

We claim:

1. In an integrated circuit (IC), a method for preparing a printed metal surface for the deposition of an organic semiconductor material, the method comprising:
   providing a substrate with a top surface;
   forming a metal layer overlying the substrate top surface;
   simultaneous with a thermal treatment of the metal layer, exposing the metal layer to a gaseous atmosphere with thiol molecules; and,
   subsequent to the thermal treatment, depositing an organic semiconductor material overlying the metal layer.

2. The method of claim 1 wherein exposing the metal layer to the gaseous atmosphere with thiol molecules includes evaporating a liquid containing thiol molecules in an ambient air atmosphere.

3. The method of claim 1 wherein exposing the metal layer to the gaseous atmosphere with thiol molecules includes passing a delivery gas through a liquid containing thiol molecules.

4. The method of claim 1 wherein forming the metal layer includes printing a metal that includes solvents;
   wherein the thermal treatment of the printed metal evaporates the solvents; and,
   wherein exposing the metal layer to the gaseous atmosphere with thiol molecules includes sulfur from the thiol molecules bonding with a printed metal top surface.

5. The method of claim 4 wherein printing the metal includes using a printing process selected from a group consisting of inkjet printing, gravure printing, flexographic printing, offset printing, screen printing, spin-on coating, aerosol deposition, stamping, and dip-coating.

6. The method of claim 1 further comprising:
   in response to exposing the metal layer to the gaseous atmosphere with thiol molecules, increasing a work function of the metal layer.

7. The method of claim 4 wherein printing the metal includes printing a silver metal;
   wherein increasing the work function of the metal layer includes forming a silver metal layer with a work function of greater than, or equal to 5.1 electron volts (eV).

8. The method of claim 4 wherein the thermal treatment of the metal layer includes heating at a temperature of about 120 degrees C. for a duration of about 40 minutes.

9. The method of claim 1 further comprising:
   forming a gate electrode overlying the substrate;
   forming a gate dielectric overlying the gate electrode;
   wherein forming the metal layer includes forming source (S) and drain (D) electrodes overlying the gate dielectric, exposing a gate dielectric channel interface region between the S/D electrodes;
   wherein depositing the organic semiconductor material overlying the metal layer includes forming an active organic semiconductor layer overlying the S/D electrodes and gate dielectric channel interface; and,
   forming an organic thin-film transistor (OTFT).

10. The method of claim 9 wherein forming the gate dielectric includes forming the gate dielectric from a material selected from a group consisting of organic insulators, ultra violet (UV) cross-linked organic polymers, and thermally cross-linked polymers.

11. The method of claim 1 wherein depositing the organic semiconductor includes forming the organic semiconductor material from a material selected from a group consisting of small molecule organic semiconductors, polymeric organic semiconductors, and blends of the above-mentioned materials.

12. The method of claim 1 wherein forming the metal layer includes forming the metal layer from a material selected from a group consisting of silver (Ag), gold (Au), copper (Cu), palladium (Pd), and platinum (Pt).

13. A method for forming an organic thin-film transistor (OTFT), the method comprising:
   providing a substrate;
   forming a gate electrode overlying the substrate;
   forming a gate dielectric overlying the gate electrode;
   printing metal source (S) and drain (D) electrodes overlying the gate dielectric, exposing a gate dielectric channel interface region between the S/D electrodes;
   simultaneous with a thermal treatment of the S/D electrodes, exposing the S/D electrodes to a gaseous atmosphere with thiol molecules; and, subsequent to the thermal treatment, forming an active organic semiconductor layer overlying the S/D electrodes and gate dielectric channel interface; and, forming the OTFT.

* * * * *